United States Patent [19]
Kolesar

[11] Patent Number: 5,760,530
[45] Date of Patent: Jun. 2, 1998

[54] PIEZOELECTRIC TACTILE SENSOR

[75] Inventor: Edward S. Kolesar, Beavercreek, Ohio

[73] Assignee: The United States of America as represented by the Secretary of the Air Force, Washington, D.C.

[21] Appl. No.: 995,230

[22] Filed: Dec. 22, 1992

[51] Int. Cl.$^6$ .................................................. H01L 41/08
[52] U.S. Cl. ........................... 310/339; 310/317; 310/319
[58] Field of Search ................................... 310/316–319, 310/338, 339, 800, 330–332, 328; 345/365 A; 73/862.04; 414/730; 364/558; 901/46, 33

[56] References Cited

U.S. PATENT DOCUMENTS

| | | | |
|---|---|---|---|
| 3,474,268 | 10/1969 | Rudnick | 310/328 |
| 3,902,084 | 8/1975 | May, Jr. | 310/328 |
| 3,955,049 | 5/1976 | MacNeill et al. | 310/332 X |
| 4,328,441 | 5/1982 | Kroeger, Jr. et al. | 310/319 |
| 4,394,773 | 7/1983 | Ruell | 310/318 X |
| 4,539,554 | 9/1985 | Jarvis et al. | 345/365 |
| 4,555,953 | 12/1985 | Dario et al. | 310/338 X |
| 4,588,348 | 5/1986 | Beni et al. | 414/730 |
| 4,633,123 | 12/1986 | Radice | 310/339 |
| 4,634,917 | 1/1987 | Dvorsky et al. | 310/339 X |
| 4,638,468 | 1/1987 | Francis | 310/318 |
| 4,640,137 | 2/1987 | Trull et al. | 73/862.04 |
| 4,709,342 | 11/1987 | Hosoda et al. | 310/338 X |
| 4,745,812 | 5/1988 | Amazeen et al. | 73/862.04 |
| 5,055,838 | 10/1991 | Wise et al. | 310/338 X |
| 5,153,476 | 10/1992 | Kosinski | 310/316 X |
| 5,160,870 | 11/1992 | Carson et al. | 310/339 |

Primary Examiner—Mark O. Budd
Attorney, Agent, or Firm—Gerald B. Hollins; Thomas L. Kundert

[57] ABSTRACT

A two-dimensional, electrically-multiplexed robotic tactile sensor realized by capacitively coupling a piezoelectric film such as a polyvinylidene fluoride (PVDF) polymer film to a monolithic silicon integrated circuit. The disclosed integrated circuit incorporates 64 identical sensor electrodes arranged in a symmetrical 8×8 matrix and physically adjacent electronic amplification for each sensor electrode signal. The response of a typical tactile sensor is linear for loads spanning the range of 0.8 to 135 grams of force and provides a response bandwidth of 20–25 Hz. Stability and response reproducibility limitations often associated with piezoelectric-based tactile sensors are resolved by a precharge voltage bias sequence for the PVDF film which initializes the pre-and post-load sensor responses. Recognition of sharp-edge, square, trapezoid, isosceles triangle, circle, toroid, slotted screw, and cross-slotted screw shapes using the sensor is also disclosed.

20 Claims, 10 Drawing Sheets

PIEZOELECTRIC TACTILE SENSOR

RIGHTS OF THE GOVERNMENT

The invention described herein may be manufactured and used by or for the Government of the United States for all governmental purposes without the payment of any royalty.

BACKGROUND OF THE INVENTION

This invention relates to the field of mechanical force to electrical signal transducers.

The sense of touch is of particular importance to autonomous robots. The accomplishment of intricate manipulative manufacturing tasks requires a robot to first grasp an object without damaging it, and second, to determine its physical characteristics; for example, its weight, shape, orientation, hardness, texture, and temperature [1, 3–5, 8]. (This and each of the bracket enclosed groups of numbers herein refer to numbered items of additional information in the bibliography at the end of this specification; each of these listed items of information is also hereby incorporated by reference herein.) Collectively, this physical sensing modality is referred to as taction [9–12]. A desirable tactile sensor will not only detect an object's morphology, it will also determine the amount of force and torque required to grasp it without slippage during manipulation.

The solution to a presently perceived tactile sensing problem in the robotic art will, therefore, likely involve gripper-mounted sensors composed of two-dimensional arrays of closely-spaced force sensing elements (taxels) which are linked to a computer dedicated to the tasks of gathering and interpreting the sensor's data to develop a tactile image of a grasped object. It is conceivable that, with rapid and repetitious sensor scans, the processed information will be sufficiently precise to be useful for controlling the grasp and manipulation of an object, thereby expanding the functionality and autonomy of the host robot.

Emerging tactile sensors seek to quantitatively measure contact forces (or pressures), mimic human-like spatial resolution and sensitivity, operate with large bandwidth or fast force-to-signal response, and provide a linearizable response without manifesting significant hysteresis. To be successful in this endeavor, a general-purpose robotic manipulator or gripper tactile sensor, in addition to being cost-effective, compliant (conformable to irregular surfaces), and physically robust, is envisaged to possess other specific characteristics, namely:

1. A limited number of sensor elements or taxels to minimize tactile image processing time; typical array size estimates range from 25 (5×5) to 256 (16×16).
2. Taxel spacing to mimic the human two-point limen (threshold) of 1 mm center-to-center.
3. Sensitive to forces spanning a range of 1 gram to 1000 grams; an incremental force resolution of 1 gram is desirable.
4. A discrete taxel response bandwidth of 100 Hz; however, this capability will likely be under-utilized on a time-averaged basis.
5. Reasonable response linearity; some nonlinearity can be accepted provided computational resources can compensate for it.
6. Negligible hysteresis; however, a known transfer function can compensate computationally.

Additional details regarding these and other sensor characteristics are provided in references [1,3,5,8]. Toward the goal of enhancing the tactile performance of robots, several tactile sensor technologies are considered potentially useful. Excluding the simple contact or switching sensor which only yields one bit of information, feasible tactile sensor technologies include: optical [1–5,13–17], chemico-, mechano-, and piezo-resistive sensors [1–5,18–23], capacitive [3–5, 24–26], inductive [4,5,27], piezoelectric [1,3–5,18,24, 28–34], and acoustic [1,4,5,35–48] transducers.

The patent art reveals a number of tactile sensor inventions which are of general interest in this environment. Included in this art is U.S. Pat. No. 4,588,348 issued to Gerardo Beni et al and concerned with a robotic system utilizing a tactile sensor array. The tactile sensing elements of the Beni invention are of the magnetic flux operating type (inductive) and are, therefore, of limited interest with respect to the present invention.

This patent art also includes U.S. Pat. No. 4,539,554 issued to J. F. Jarvis et al which is concerned with a piezoelectric tactile sensor and an accompanying sensing circuit all of which are mounted on a silicon substrate member. The Jarvis sensor contemplates use of a piezoelectric polyvinylidene fluoride polymer material and speaks of a dummy reference cell 39. The tactile sensor of the present invention is distinguished over the Jarvis sensor by the piezoelectric film recharging or reconditioning sequence disclosed herein and by resistivity considerations in the dielectric material.

The patent art also includes U.S. Pat. No. 4,745,812 issued to C. A. Amazeen et al which is concerned with a tactile sensor having triaxial force-sensing capabilities. The Amazeen sensor is primarily concerned with the piezoresistive force sensing technology and is, thereby, also principally of background interest with respect to the present invention.

The patent art also includes U.S. Pat. No. 4,640,137 issued to M. W. Trull et al which is concerned with a tactile sensor operating in the manner of the element in a bipolar transistor; that is, tactile sensing elements functioning as an emitter and a collector. This operating arrangement is significantly different from that of the present invention.

SUMMARY OF THE INVENTION

The present invention is concerned with a tactile sensor resulting from the direct coupling of a piezoelectric thin film, typically a PVDF polymer, to a dielectrically-isolated (for example, chemically-vapor deposited, $10^{14}$ ohm.centimeter resistivity, 3 micron thick $SiO_2$ material) electrode matrix realized on a silicon integrated circuit semiconductor substrate. To minimize electrical noise and impedance mismatch effects, a two-dimensional matrix of in situ high-input impedance and typically metal-oxide-semiconductor field-effect transistor (MOSFET) amplifiers are directly gate-contact coupled to the lower surface of the piezoelectric PVDF polymer film. The in situ MOSFET amplifiers provide an electrically isolated and physically separate, but identical, high-input impedance, ($>10^{12}$ ohms) voltage measurement capability for each taxel. Short length electrical conductors that are supported and coated with a high-quality, chemically-vapor deposited, silicon dioxide material of 3 microns thickness minimize the coupling capacitance between the taxel conductors.

The in situ MOSFET amplifiers electrically and physically isolate the PVDF film, have a low output impedance, and amplify the taxel's response to an acceptable signal level without seriously reducing the piezoelectric material's discharge characteristic. External commercially-available discrete ICs are used to implement an electronic multiplexer for scanning the MOSFET amplifier output signals of an 8×8 taxel matrix in less than 5 milliseconds (ms). Since response stability and reproducibility has historically limited the utility of piezoelectric-based tactile sensors [1,3–5,18,24, 28–33], a pre-charge stabilization voltage bias cycle is incorporated as part of the overall tactile sensor system, and is used to impress a short-duration (e.g., 0.1 second), low-level, direct current bias voltage (e.g., $V_{bias}$=2.5 V) between the upper and lower electrodes of the PVDF film and the input gate contact of the MOSFET amplifiers between load force applications [34]. This pre-charge interval has been found to physically pre-condition the PVDF film to a uniform and reproducible (or predictable) condition and minimize the tactile response voltage fluctuations observed with applications of widely-varying magnitudes of external load forces.

It is therefore an object of the present invention to provide an improved piezoelectric tactile sensor arrangement.

It is another object of the invention to provide a high resolution piezoelectric tactile sensor which can image the silhouette of a contacted object.

It is another object of the invention to provide a tactile sensor having force mapping and force amplitude measuring capabilities which can image the silhouette of a contacted object.

It is another object of the invention to provide a tactile sensor of the piezoelectric type wherein minimum signal charge loss is achieved.

It is another object of the invention to provide a piezoelectric tactile sensor arrangement wherein the sensor and an unusually high-input impedance electronic amplifier are located in close physical proximity.

It is another object of the invention to provide a piezoelectric tactile sensor whose response is measured through the use of an electronic multiplexer arrangement.

It is another object of the invention to provide a piezoelectric tactile sensor arrangement in which the dynamic signal range limitations are enhanced with a pre-charge and pre-conditioning cycle of the piezoelectric material and the input gate capacitance of the in situ MOSFET amplifiers.

It is another object of the invention to provide a piezoelectric tactile sensor having object recognition capable output resolution.

Additional objects and features of the invention will be understood from the following description, claims, and accompanying drawings.

These and other objects of the invention are achieved by a force magnitude and force pattern responsive tactile sensing apparatus comprising the combination of:

- a two dimensional array of electrode elements disposed in electrical isolation via a high-quality, chemically-vapor deposited $SiO_2$ dielectric across a planar surface area portion of a semiconductor substrate member;
- a force responsive, physically-deformable film of piezoelectric effect material disposed over the array of electrode elements and the substrate member surface area portions in first film surface capacitive coupling with the electrode element array;
- an electrically conductive common electrode member disposed over a second distal surface portion of the film of piezoelectric effect material and connected with a common return electrical node of the sensing apparatus;
- electronic amplifier means, including a plurality of electronic amplifier circuits physically disposed adjacent to said array of electrode elements with each of the amplifier circuits having input nodes connected with one of the electrode elements and with the common return electrical node, for amplifying a piezoelectric effect electrical charge signal received on the electrode element during sensed tactile force physical deformation events of the film of piezoelectric effect material;
- electrical charge generating means electively connectable with each the electrode element of the array for pre-conditioning the piezoelectric effect material prior to each tactile force physical deformation event.

DETAILED DESCRIPTION

Figure 1:
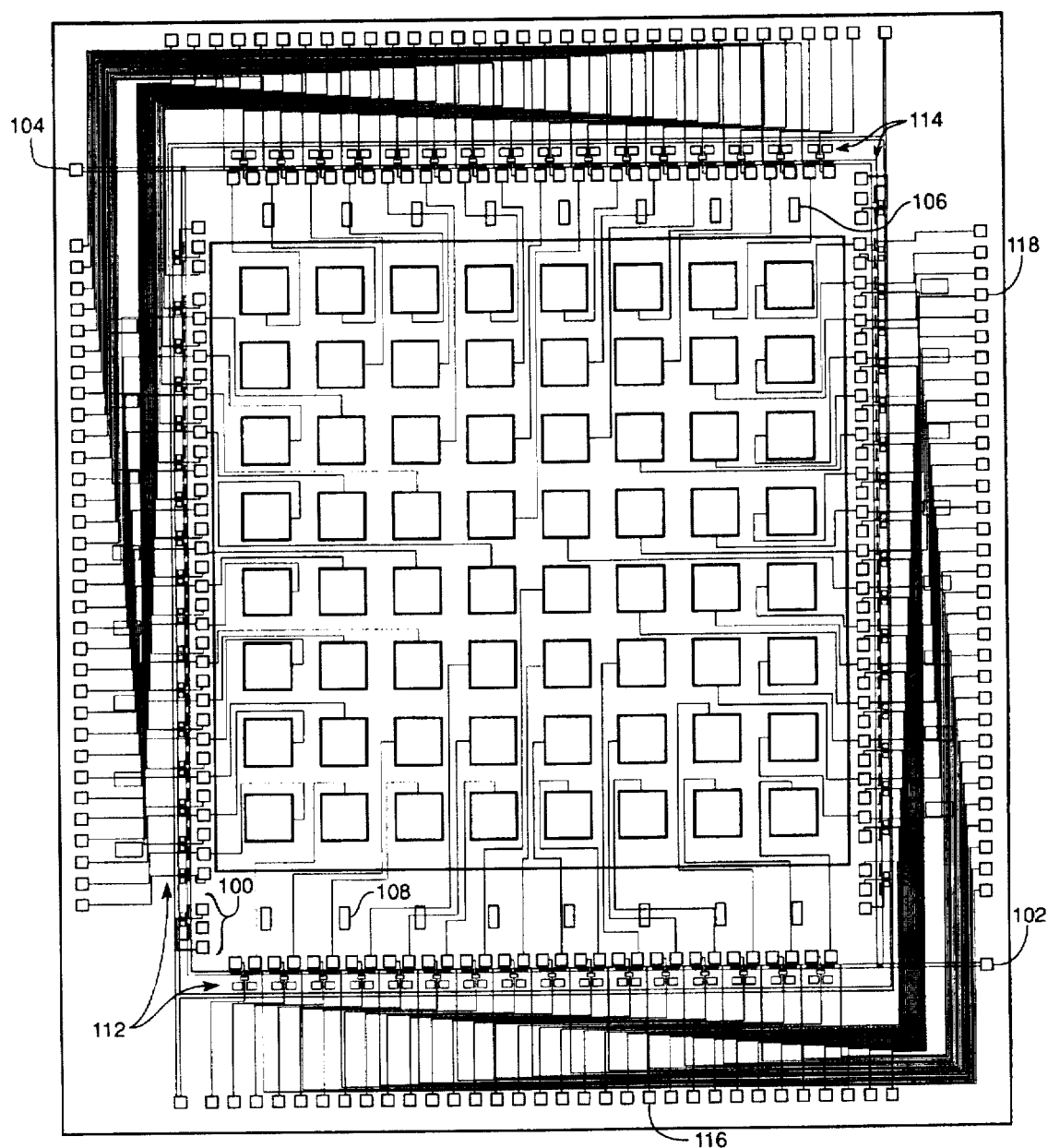
FIG. 1 shows a microphotograph of a tactile integrated circuit sensor signal collection and amplification array according to the invention.

The widely-known piezoelectric polyvinylidene fluoride polymer, (commonly referred to as PVDF, PVF, PVF2, and $PVF_2$) when compared to the piezoresistive thin films, is universally recognized for its robust mechanical and its chemically inert properties, and is considered advantageous for realizing a tactile sensor. This material also manifests a large piezoelectric coefficient which translates into favorable force sensitivity, excellent linearity, low hysteresis, a small dielectric loss, and stability with temperature. A prolonged exposure of several years to temperatures greater than 60° C., or a short-term exposure of tens of minutes to temperatures greater than 100° C., will, however, degrade its piezoelectric activity and its inherent anisotropic nature. (An anisotropic nature facilitates common-mode rejection and electrical signal isolation in a tactile sensor.) The most significant limitation of this PVDF material includes its inherent pyroelectric effect, which manifests itself in a tactile sensor application as an undesirable sensitivity to temperature changes and gradients.

The functionality of piezoelectric-based tactile sensors can be attributed to the well-established piezoelectric effect which predicts the surface charge in a piezoelectric material produced by the application of an external force. The finite surface charge (Q) produced is proportional to the applied force (F) via the relation, $$Q = SF, \qquad (1)$$

where S is the charge sensitivity constant of the piezoelectric material [1,4,5]. By utilizing the piezoelectric material as the dielectric medium in a parallel plate capacitor configuration, the ideal (assuming a lossless dielectric and ignoring edge effects) capacitance (C) is given by $$C = \epsilon_o \epsilon_r A/d \qquad (2)$$

where A is the electrode's surface area, d is the dielectric's thickness, $\epsilon_o$ is the permittivity of free space, and $\epsilon_r$ is the relative dielectric constant collinear with the direction of the applied force ($\epsilon_r = 11$ for PVDF [29,30,34]). Thus, by invoking Gauss' Law, the open-circuit voltage (V) generated at the capacitor's terminals is given by $$V = Q/C = (S/C)F \qquad (3)$$

Most PVDF-based tactile sensors lack a static or steady-state response; that is, such sensors provide a signal only while the piezoelectric material is being deformed. This behavior can be attributed to the piezoelectric effect producing a finite surface charge on the PVDF film upon the application of an external force, to the material's inherent dielectric loss, and to the electrical measurement circuit being responsible for a shunt leakage resistance path for this finite quantity of charge. The shunt leakage resistance (R) and capacitance (C) produce a characteristic discharge time constant (t=RC=r $\epsilon_r$ $\epsilon_o$, where r is the material's resistivity, $\epsilon_r$ is the material's relative dielectric constant, and $\epsilon_o$ is the permittivity of free space for this finite charge).

For high-quality piezoelectric PVDF films, t is on the order of a few seconds. Consequently, a taxel scanning system which incorporates an extremely high-input impedance amplifier and a fast multiplexer is needed for sensor systems incorporating this piezoelectric material. A compelling motivation in the present invention is, therefore, to minimize influencing the taxel sensor's inherent characteristic discharge time constant via the input impedance of the charge voltage sensing scheme. This requirement may be satisfied with the combination of a high-input impedance circuit and by scanning the taxel matrix or array sufficiently fast, on the order of 50 microseconds; for each taxel (less than 5 milliseconds for an entire 8×8 array), for example, in order to capture an essentially static tactile object image.

For a tactile sensor the size of an adult's fingertip, a silicon IC with peripheral dimensions of 9200×7900 microns may be obtained using the Metal-Oxide-Semiconductor Implementation System's (MOSIS) 2-μm, n-well, two-level metal, complementary metal-oxide-semiconductor (CMOS) technology [49]. After reserving a portion of the IC's area for the in situ MOSFET amplification and output interface circuitry, an 8×8 taxel matrix may be allocated to a 5300×5300 μm area, such that the sensor's ideal spatial resolution is somewhat better than that of an adult's fingertip [3–5,9–12]. To enhance physical robustness and minimize electrical and mechanical coupling between discrete taxels, the PVDF film's upper surface serves as a common low resistance electrical ground plane after being uniformly coated with a sputtered nickel film that is typically 800 Å thick. The individual taxel electrodes may be 400×400 μm in size, and they should be separated from their nearest-neighbors by at least 300 μm to ensure electrical and physical isolation. This 400 μm electrode dimension and 300 μm spacing, in fact, has the effect of maximizing sensor resolution while minimizing taxel cross-talk coupling.

A preferred arrangement of the tactile sensor's amplification and output interface circuitry and electrode matrix (without the PVDF film) is illustrated in FIG. 1 of the drawings. In FIG. 1, a set of 64 in situ MOSFET amplifiers as indicated at 112 and 114 are located around the periphery of the taxel electrode matrix on the IC. The amplifier circuit at 100 is a test circuit. Located at two of the IC's four corners are voltage bias pads 102 and 104 which are used to establish wire bond connections to the 800 Å thick surface electrode nickel film that is located on the top surface of the PVDF film—after the PVDF film has been attached. Although one wirebond connection will provide full functionality, two spatially separate connections are preferred to add a measure of redundancy.

The FIG. 1 electrode matrix or array is also surrounded by the rectangular shaped alignment marks indicated typically at 106 and 108 to facilitate locating particular taxels which are, of course, masked after the opaque PVDF film is attached. The large number of pads at 116 and 118, for example, on the FIG. 1 IC's periphery are wire bond terminations usable to interface the IC tactile sensor with a pin-grid array (PGA) package which serves to couple the tactile sensor signals to an externally configured electrical multiplexer. To minimize stray surface leakage currents and parasitic coupling impedances, level-one metal electrode interconnect conductors are electrically isolated with a 3-μm thick dielectric silicon dioxide ($SiO_2$) layer in the FIG. 1 circuit chip. The resistivity of the $SiO_2$ layer is typically greater than $10^{14}$ ohm.cm; this high-quality dielectric can be achieved via the standard chemical-vapor deposition IC process.

The ideal force sensitivity threshold for the FIG. 1 tactile sensor can be established by considering perpendicularly applied force components and neglecting transverse stresses in the film plane. Under this idealized situation, the charge sensitivity constant (S) for the preferred biaxially-stretched 40-μm thick PVDF film can be interpreted as the axial piezoelectric stress constant, $d_{33} = 16 \times 10^{-12}$ coulombs/N [29, 30,32,34]. Thus, from Eqs. (2) and (3), for an applied force of 1 gram (or 1 gmf) uniformly distributed over the 400×400 μm taxel electrode area, the open-circuit signal voltage (V) theoretically can be expected to be approximately 0.41 volts. In practice, however, this signal value is smaller principally because of the inherent mechanical losses associated with coupling the applied load force to the film, the presence of the dielectric adhesive used to capacitively couple and attach the PVDF polymer to the taxel electrode matrix (which manifests itself as a series capacitance), and the parasitic capacitance attributable to the electrode interconnect conductors.

To achieve a gain greater than unity for the in situ gate-coupled MOSFET amplifiers and increase the taxel's signal, a cascade configuration of two MOSFET inverting amplifiers can be utilized. To ensure that the theoretically postulated 0.41 volt open-circuit response signal associated with a 1 gmf load is not seriously corrupted with noise when it is passed through the externally connected multiplexer circuit, the amplification stage may be configured using a software design tool, such as SPICED® [50–51], to provide a gain of 1.25 in its linear operating region of 2.5 to 13 V. This range may also be conveniently centered at 7.75-V for use with a 15-V ($V_{dd}$) operating bias.

As discussed in the reference [34] publication, a digital logic circuit multiplexer may be used to capture and store into a computer's memory, a tactile sensor's time-division multiplexed set of 64 amplified voltage responses. This can be accomplished within a 20 ms window with the additional time above the previously recited 5 ms being required to store the data file in the computer memory. A digital storage oscilloscope (DSO) (model HP 54100A, Hewlett-Packard, Inc., Palo Alto, Calif. 94304) connected to the multiplexer's output may be used to experimentally or, by example, view the signal of each tactile sensor electrode. The tactile sensor's response data may be collected from the multiplexer with a microcomputer, such as a model Z248 from Zenith Data Systems Corp., St. Joseph, Mich. 49085 using an IEEE-488 interface plug-in card model 01000-60300, from Capital Equipment Corp., Burlington, Mass. 01730. Although the DSO and Zenith computer instruments provide the means to rapidly study and test various arrangements for the taxel sensor, the use of dedicated signal processing hardware or possibly hardware plus software replacements for these instruments is, of course, preferred in a practical embodiment of the invention.

The FIG. 1 illustrated inclusion of the PVDF film voltage bias pads that are externally accessible after the PVDF film is attached to the IC facilitates the use of signal collection taxel electrode areas or array elements for voltage bias pre-conditioning of the PVDF film in addition to their use as signal collection electrodes. Each of these pads is wire bonded to an IC package pin which is routed to one terminal of either a magnetically-triggerable SPST reed switch (Potter and Brumfeld, model JWD-171-21, Oakland, N.J. 07436) or to an electrically-triggerable, ultra-low leakage ($10^{12}$ ohms "off"-state) SPST CMOS IC switch (Maxim Integrated Products, product MAX327CPE, 120 San Gabriel Drive, Sunnyvale, Calif. 94086) which contains four discrete switches per IC. Both of these SPST switch technologies are compatible with the few electrons of charge that form the signal developed by a small force deformation of the FIG. 1 array's preferred PVDF film.

The second terminal of the SPST reed switch or the CMOS IC switch is connected to a 2.5 volt power supply. The two voltage bias pads of the IC which are connected to the 800 Å thick metallized surface of the PVDF film are connected to the other power supply terminal. When the SPST reed switch or CMOS IC switch is closed, the 2.5 volt bias ($V_{bias}$) is impressed directly across the PVDF film and the input gate-coupled contact of the MOSFET amplifier. This situation impresses a common 2.5 volt bias equally across the PVDF taxel element and the input of the corresponding MOSFET amplifier.

Figure 2:
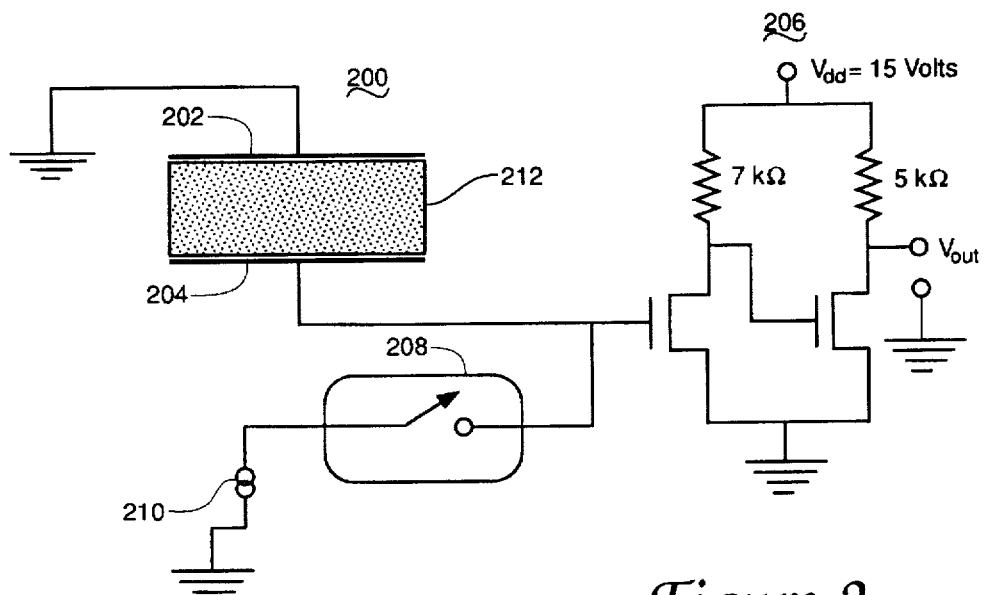
FIG. 2 shows an electrical schematic diagram of one element from the FIG. 1 array and its attending circuitry.

This pre-charge arrangement stabilizes the PVDF film and amplifier for the taxel object imaging measurement cycle. Consistent with reported results [34], pre-charge durations on the order of 0.1 second have experimentally been found to yield a significantly improved level of stability and response uniformity, as shown by comparing the darker pre-conditioned and lighter non-pre-conditioned bars in FIG. 4b of the drawings. A schematic of the preferred in situ taxel MOSFET amplifier and pre-charge voltage bias arrangement is shown in FIG. 2 of the drawings where one element of the tactile array is indicated at 200. The nickel and aluminum film electrodes of this element are shown at 202 and 204, respectively, the PDVF film at 212, the two stage $10^{12}$ ohm input impedance amplifier at 206, the SPST magnetically-triggerable reed switch or CMOS IC switch at 208, and the PVDF film physical pre-conditioning bias source is shown at 210.

SENSOR FABRICATION

Piezoelectric PVDF film such as the SOLEF® film from Solvay Technologies, Inc., New York, N.Y. 10017 and Solvay & Cie, S.A., Brussels, Belgium may be attached to the FIG. 1 silicon IC using a urethane conformal coating (coating MS-470/22, Miller Stephenson Chemical Company, Danbury, Conn. 06810). A uniform 6-µm thick layer of the adhesive may be deposited on the PVDF film square using a conventional photoresist spinner.

To ensure a uniform bond between the PVDF film and the IC, a TEFLON® compression block and clamp can be positioned to compress the (IC/urethane adhesive/PVDF film/TEFLON® compression block) sandwich. Uniform contact between the PVDF film and the IC is facilitated by storing the sensor for 30 minutes in a vacuum chamber ($10^{-6}$ Torr). Upon removal from the vacuum chamber, the entire assembly is preferably cured in a 65° C. oven for 60 minutes. Finally, the edge (border) region lying outside the array of taxel electrodes of the uppermost metallized surface of the PVDF film (800 Å thick nickel electrode) is wire bonded to the two dedicated IC voltage bias pads.

SENSOR PERFORMANCE

To minimize transient pyroelectric effects, a fabricated sensor's performance measurements are preferably accomplished isothermally (for example, at 22°±0.5° C.) under low-level illumination conditions (inside a dark-walled enclosure which simulates the physical condition where the tactile sensor and the object come into contact and exclude the ambient light). The response of a discrete taxel upon the application of a typical 35-gmf load reveals that the average onset response time to the physical force load application is approximately 0.04 seconds (a 25 Hz bandwidth), and the average discharge time upon load removal is approximately 0.05 seconds (a 20 Hz bandwidth). No significant variance is observed in these parameters for loads spanning the range of 0.8 to 135 gmf.

Figure 3:
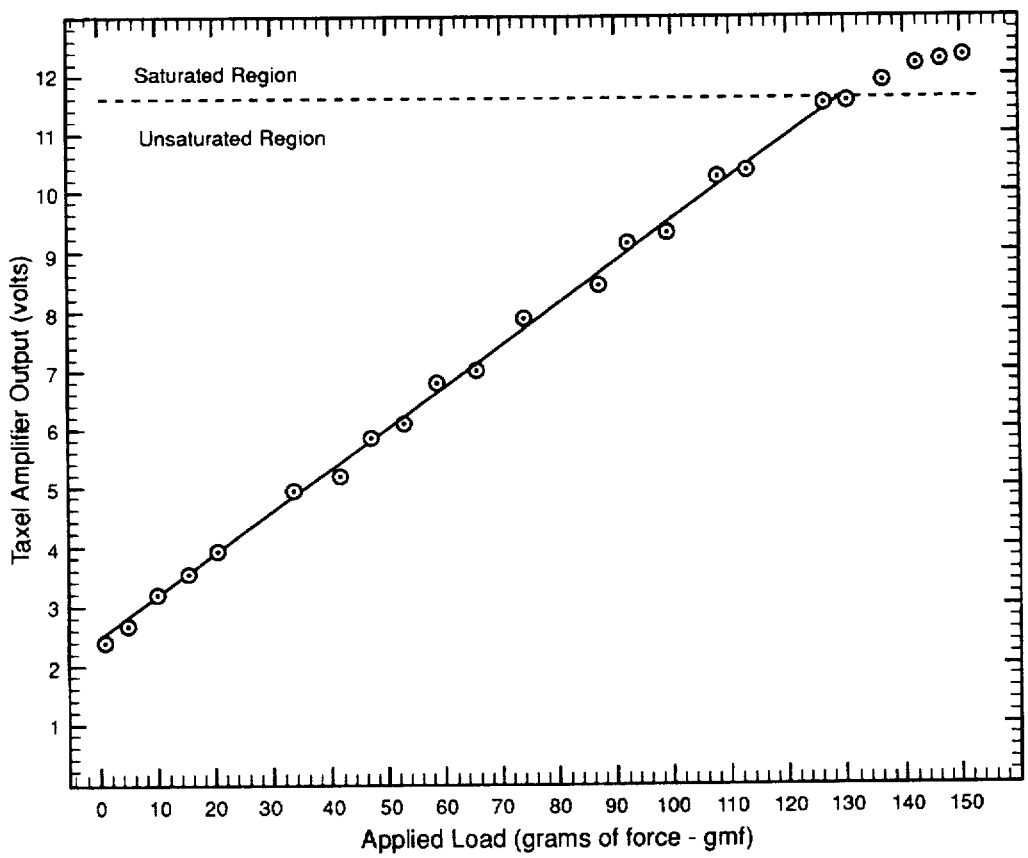
FIG. 3 shows the force-to-voltage transfer function characteristics of a FIG. 1 and FIG. 2 array transducer cell.

The asymmetry observed between the response and discharge times suggests that the sensor possesses a slight degree of hysteresis. FIG. 3 shows the discrete taxel performance response of sensors fabricated with the 40-µm thick PVDF film and pre-charged or initialized with the 2.5 Volt no-load bias for 0.5 to 150 gmf loads that are uniformly applied to a set of six randomly selected electrodes. FIG. 3 shows the discrete taxel response for loads uniformly applied to the area of the PVDF film's lower electrode. Each FIG. 3 data point represents the arithmetic average of six independent measurements. The equation of the linear least-squares line is: $V_{response}=(0.07\text{ V/gmf})$ (Applied load in gmf)+2.5 V; the 2.5 V pre-charge bias is applied before each FIG. 3 taxel applied load measurement. FIG. 3 also shows the sensor to manifest a linear response and a 0.07 V/gmf slope for loads spanning 0.8 to 135 gmf.

Figure 4A:
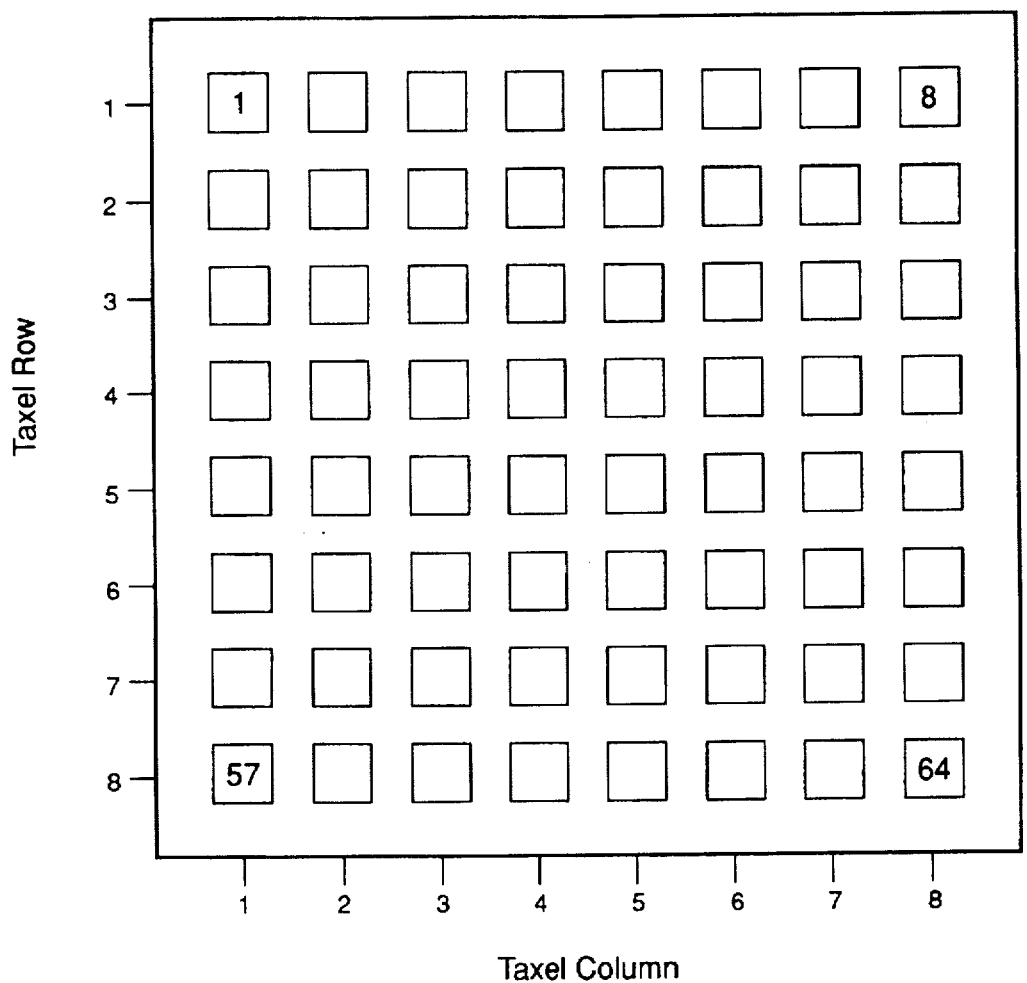
FIG. 4a shows a possible tactile element array arrangement and electrode position identification arrangement.
Figure 4B:
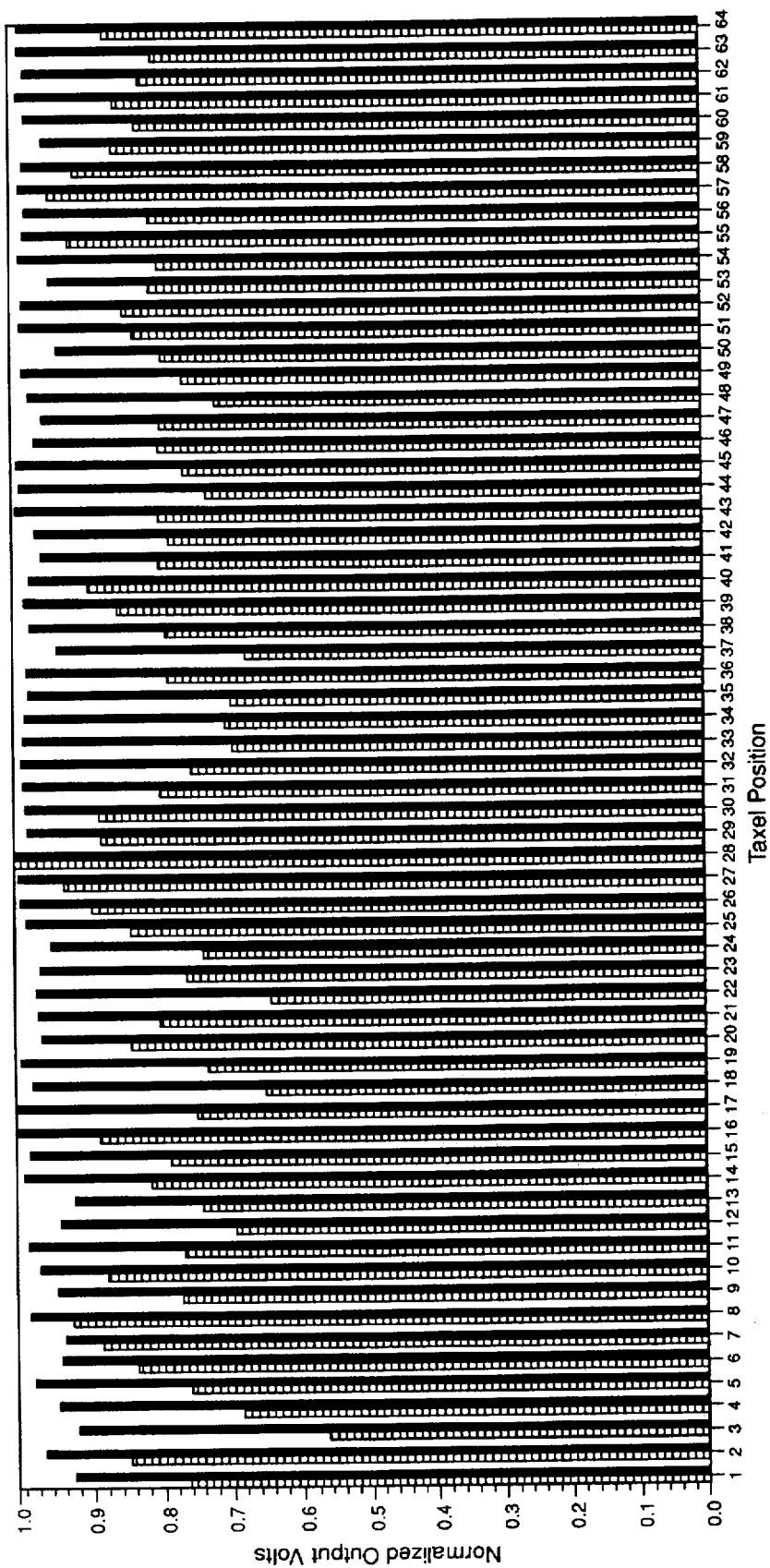
FIG. 4b shows a comparison of pre-conditioned and non-pre-conditioned tactile element output responses.

A useful degree of tactile object imaging may be accomplished with the presently described sensor. To this end, the pre-charge stabilization process may be implemented to establish a uniform pre-load response condition for the 64 taxels of the FIG. 1 sensor [34]. The enhanced level of stability and response uniformity achieved with use of the pre-charge bias technique is illustrated in FIG. 4b of the drawings. In FIG. 4b the multiplexed sensor response of the unloaded 8×8 taxel matrix before the pre-charge bias was applied to the PVDF film is shown in the left or lighter shaded bar for each taxel position, and it is compared to the improved stabilized state of the same unloaded sensor after the pre-charge cycle of a 2.5-V bias applied for 0.1 second is accomplished.

In an evaluation or experimental embodiment of the FIG. 1 sensor, after the unloaded, but pre-charged sensor matrix is scanned and the no-load discrete taxel responses are transferred from the Digital Storage Oscilliscope (DSO) or other input apparatus to the computer, a load with a particular shape and weight may be applied to the sensor. The external digital logic circuitry (multiplexer) may be utilized to scan the taxel matrix, a DSO used to capture the response of each MOSFET amplifier (stored as the arithmetic average of 8 measured (rapidly sampled) values is desirable), with the entire set of 64 taxel measurements being collected and stored in less than 5 ms. When this measurement cycle is completed, the applied load can be removed, the pre-charge cycle repeated, the matrix scanned, and a post-load sensor response data file can be created. Post-load voltage bias implementation serves two purposes. In addition to its first blush importance as a sensor stability indicator, it is also useful in a tactile object image interpretation investigation to form a compensated baseline no-load response matrix. Such a matrix may be calculated by averaging the values of the corresponding pre-and post-load taxel responses and then taking and recording (storing) the absolute value of the result.

To generate a tactile object image, the values in the compensated sensor response baseline matrix are systematically subtracted from the corresponding values in the response matrix produced by an applied load. The values in the resulting matrix are then normalized with respect to the magnitude of the largest value in the matrix, and a three-dimensional cubic-spline fitted surface plot is generated (the xy-plane corresponds to the taxel positions in the sensor matrix, and the z-axis maps the associated normalized response values). Table 1 herein describes feasible load shapes for evaluation.

The following procedure generates the tactile object image recognition criteria to assess sensor discernment of different object shapes applied with the same gmf load. A sharp-edge shaped load may be selected as a fundamental shape. From this response, criteria can be established for recognizing the tactile object image generated by other load shapes. As may be observed from the taxel electrode map and position identification scheme of FIG. 4a, a sharp-edge shaped load could be readily positioned to contact a single row, column, or internal diagonal of the taxel matrix. The criteria of matching, as closely as possible, the actual surface contact area of the applied load and that bounded by a closed contour (parallel to the xy-plane) in the normalized three-dimensional response surface plot is preferred.

Figure 5A:
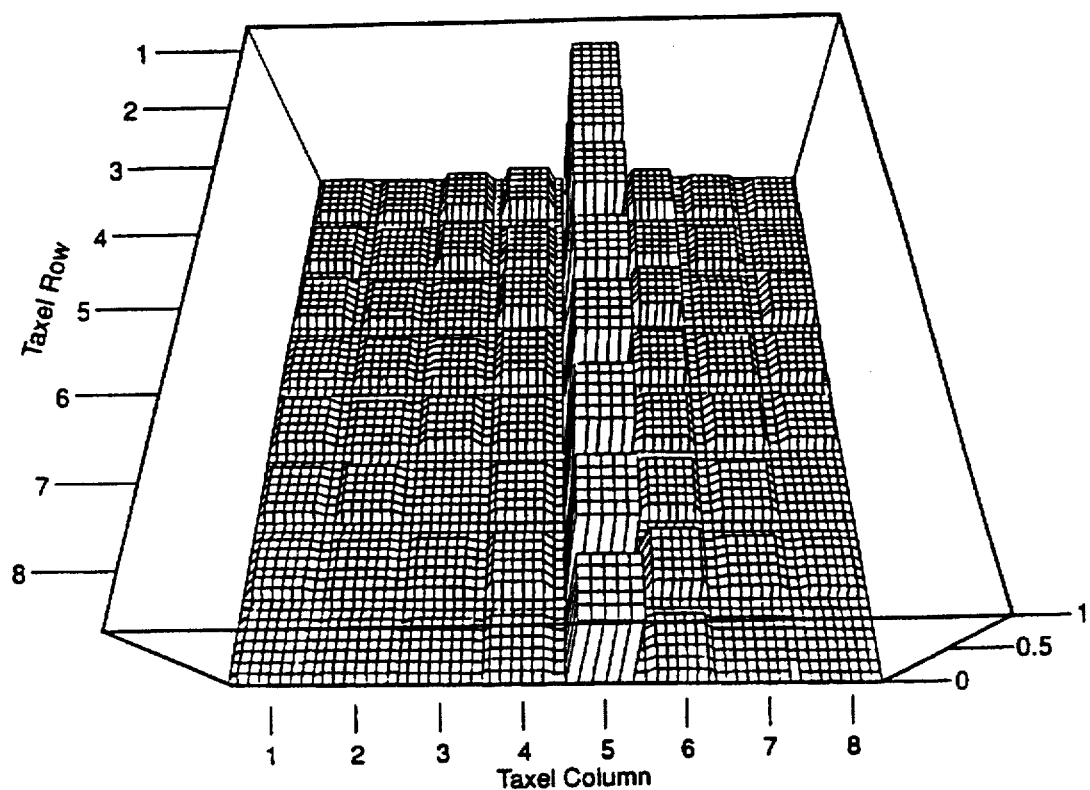
FIG. 5a shows a three-dimensional display of the normalized tactile sensor response to a vertically disposed sharp-edge shaped load force.
Figure 5B:
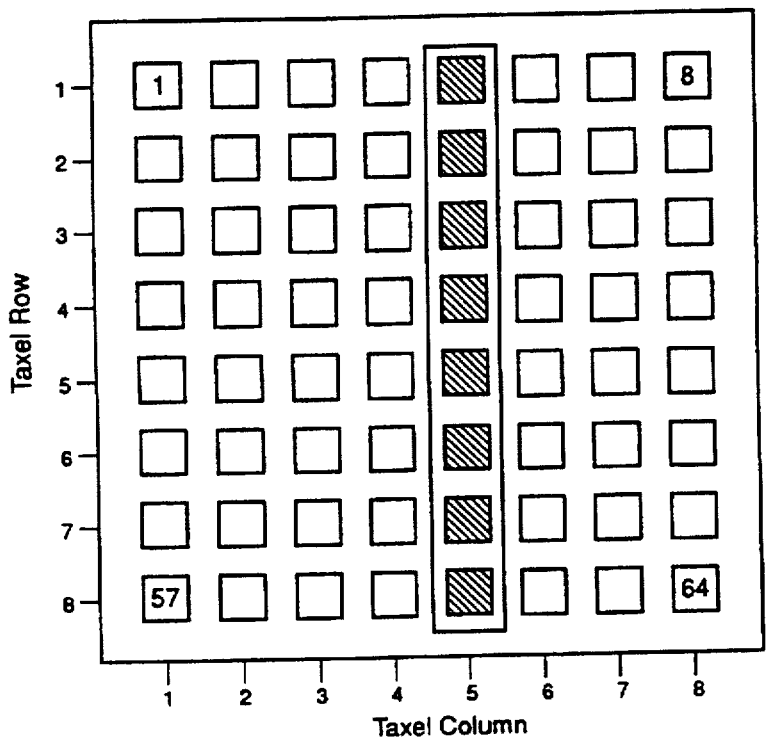
FIG. 5b shows an overlay representation of the FIG. 5a results with respect to a tactile sense element map (silhouette of the contacted object).
Figure 5C:
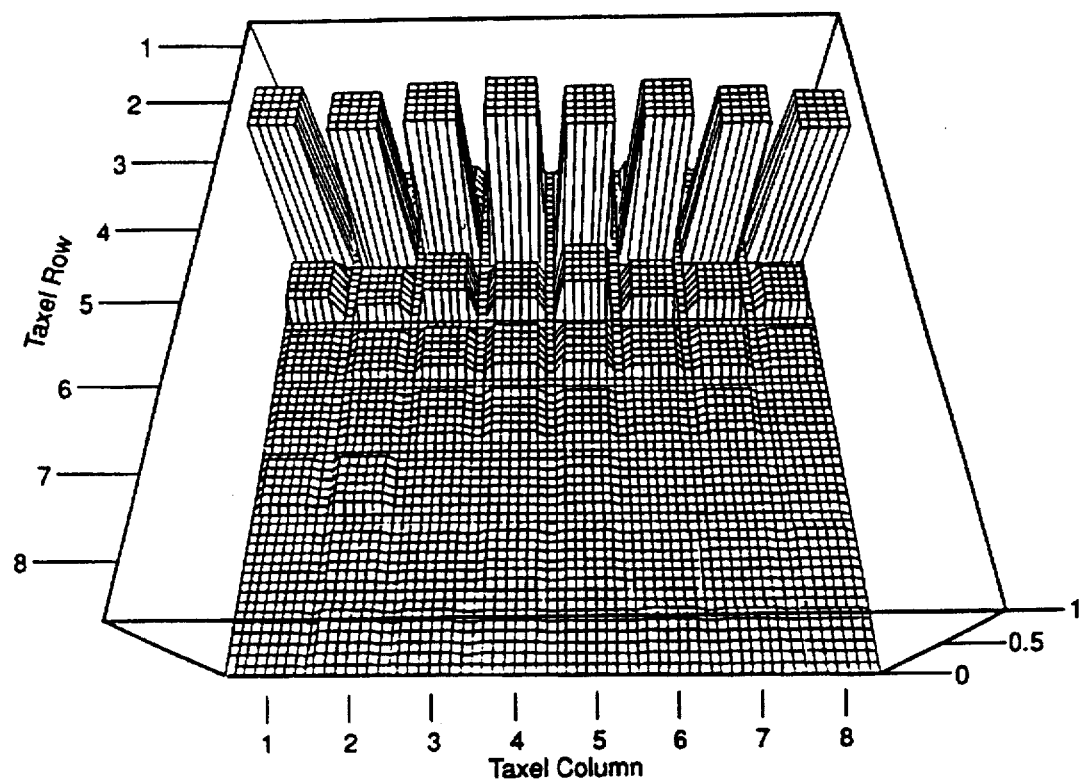
FIG. 5c shows a three-dimensional display of the normalized tactile sensor response to a horizontally disposed sharp-edge configured load force.
Figure 5D:
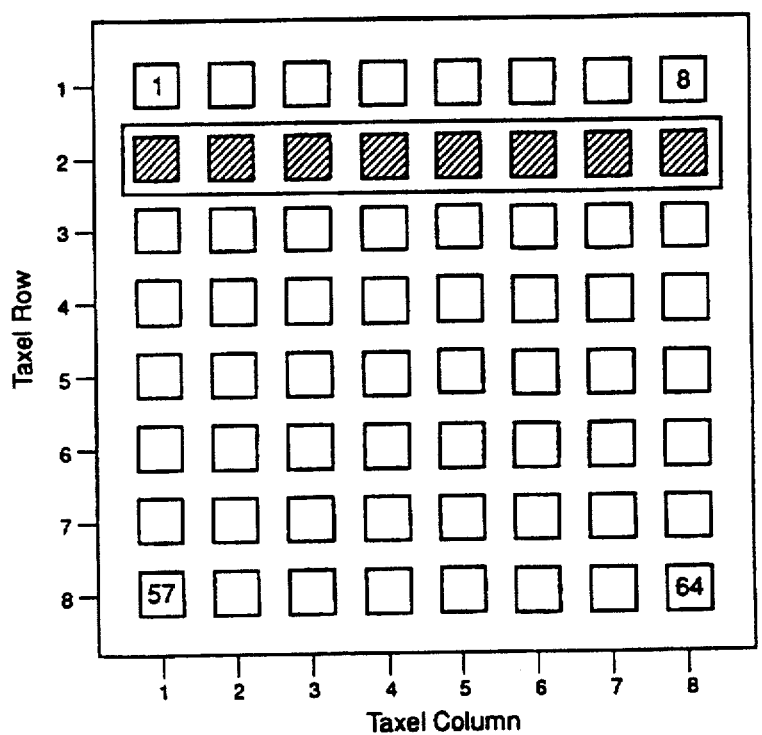
FIG. 5d shows an overlay representation of the FIG. 5c results on a tactile sensor element map (silhouette of the contacted object).
Figure 5E:
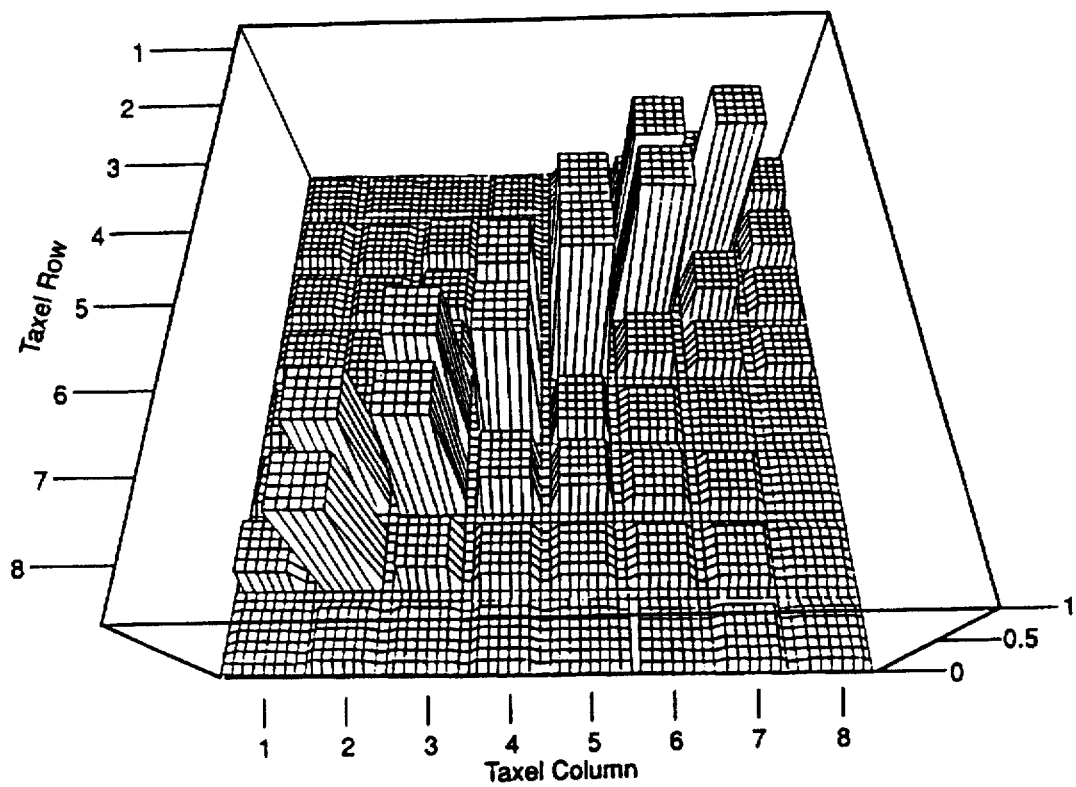
FIG. 5e shows a three-dimensional display of the normalized tactile sensor response to a diagonally disposed sharp-edge configured load force.
Figure 5F:
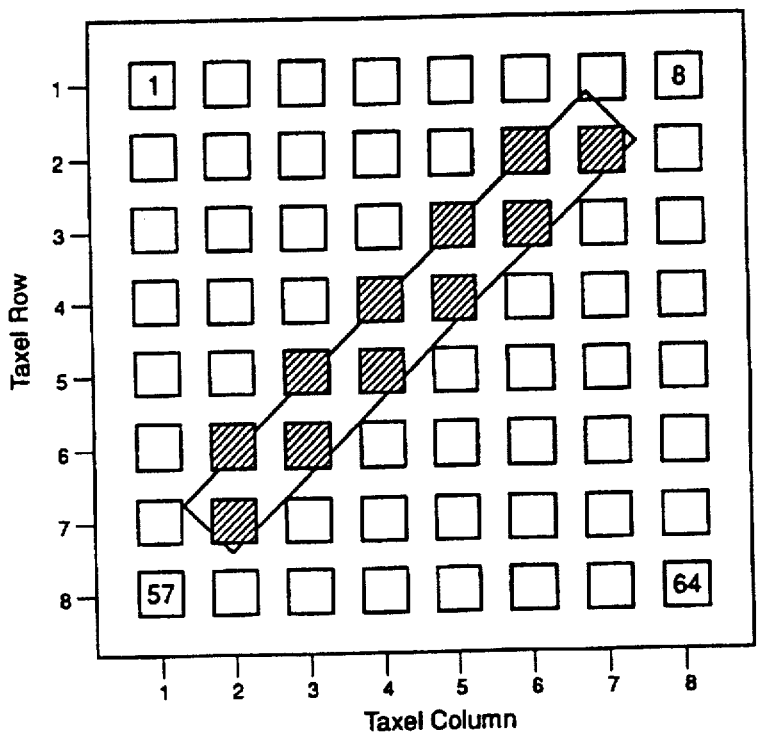
FIG. 5f shows an overlay representation of the FIG. 5a results on a tactile sensor element map (silhouette of the contacted object).

FIG. 5a, for example, depicts the normalized three-dimensional response voltage plot produced by a 100 gmf sharp-edge shaped load. FIG. 5a is, in fact, a three-dimensional plot of the normalized multiplexed voltage response (z-axis) versus position in an 8×8 taxel matrix (xy-plane) when a 100 gmf load is applied to a column of taxels. FIG. 5b depicts the z-axis value of 0.90 V that yields the best-fit contour obtained by examining contours at 0.01 V increments for imaging the shape of the FIG. 5a applied load. In the FIG. 5b overlay of the sharp-edge shaped load (i.e., the shaded rectangle) relative to the normalized voltage response best-fit level (z=0.90 V), the darkened taxels are those whose normalized response was greater than or equal to the threshold value (z=0.90 V). FIGS. 5c and 5d show the results of applying the 100 gmf sharp-edge shaped load along an orthogonal row axis of the tactile sensor, and FIGS. 5e and 5f show the results of a diagonal orientation of the sharp-edge shaped load. FIGS. 5d and 5f in this group are in the form of taxel sensor overlays for the respective load force arrangements.

To further validate the FIG. 5a through 5f rudimentary object image recognition criteria, the remaining load shapes of Table 1, which are shown below, may be independently applied as 100 gmf loads, and the data correspondingly processed. FIG. 6a–6f depict the FIG. 5 type of plots associated with a representative set of the more complex load shapes, and Table 2 summarizes the best-fit conditions identified for each particular shape.

Figure 6A:
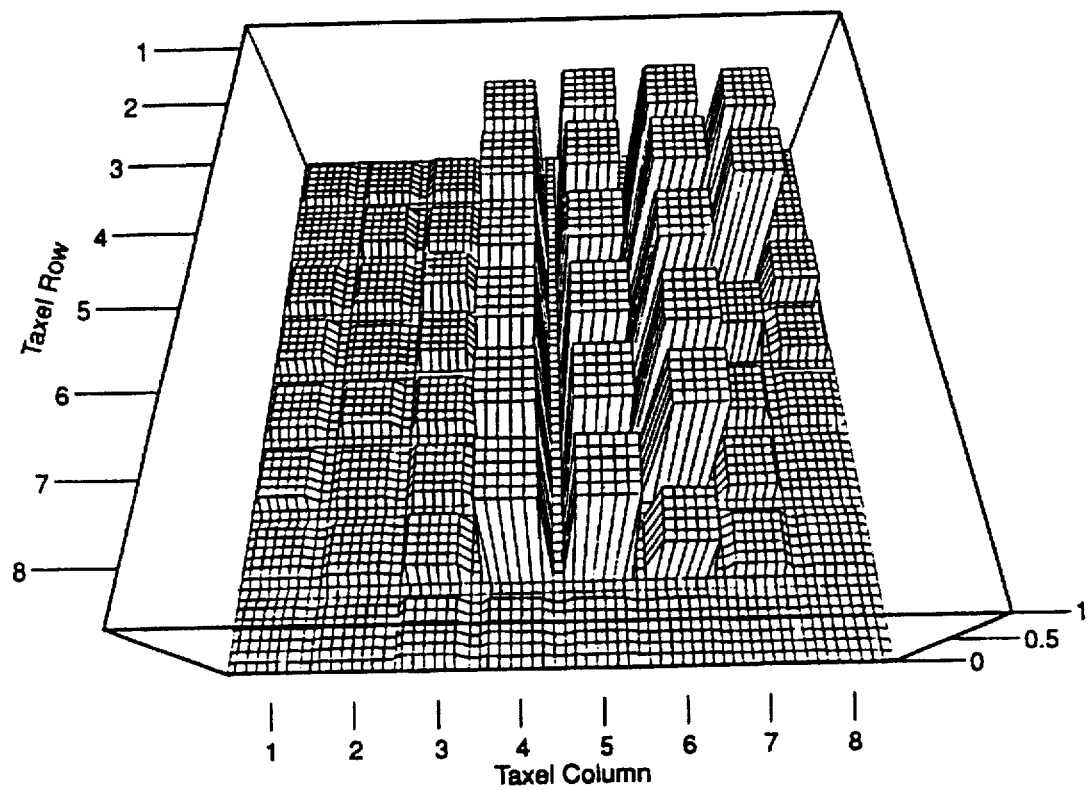
FIG. 6a shows a three-dimensional display of the normalized tactile sensor response to a trapezoid-shaped load force.
Figure 6B:
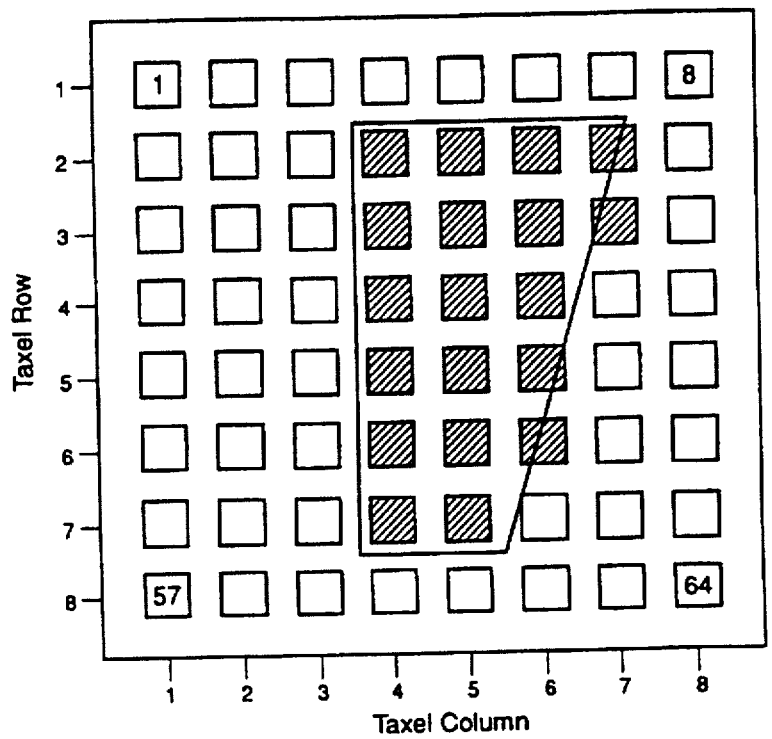
FIG. 6b shows an overlay representation of the FIG. 6a results with respect to a tactile sense element map (silhouette of the contacted object).
Figure 6C:
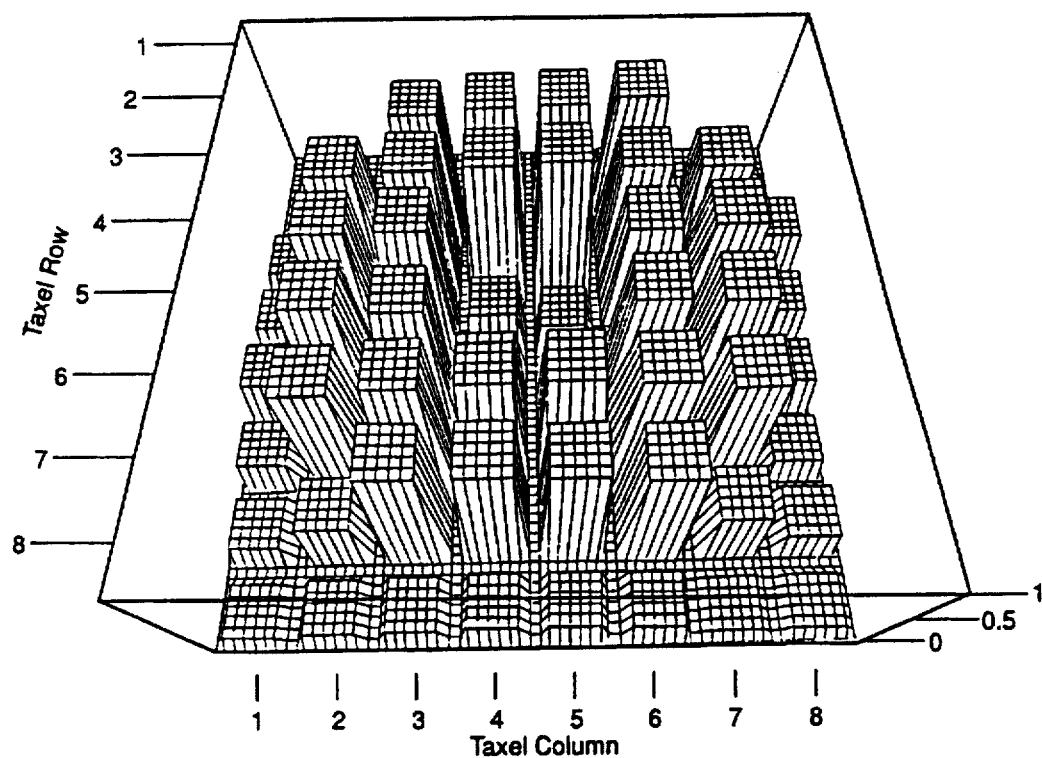
FIG. 6c shows a three-dimensional display of the normalized tactile sensor response to a toroid-shaped load force.
Figure 6D:
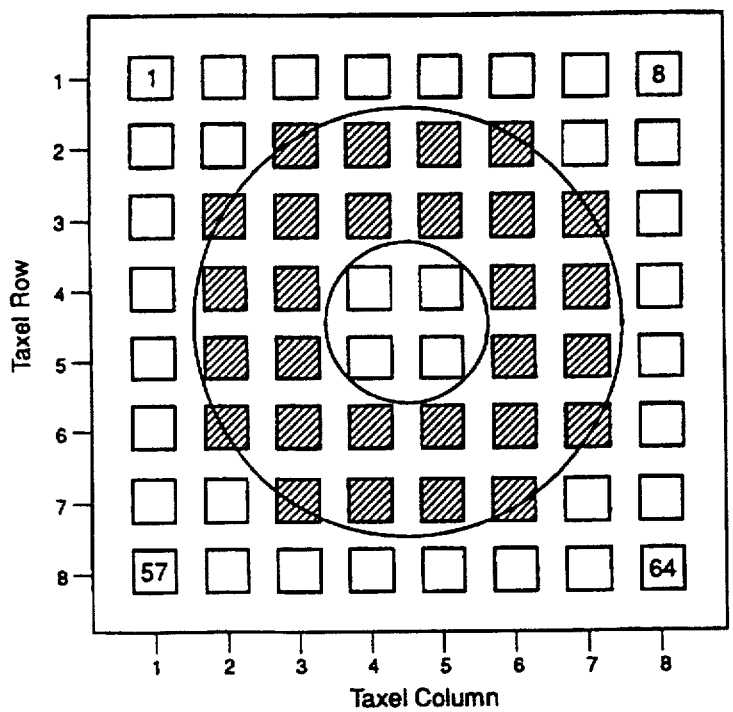
FIG. 6d shows an overlay representation of the FIG. 6c results on a tactile sensor element map (silhouette of the contacted object).
Figure 6E:
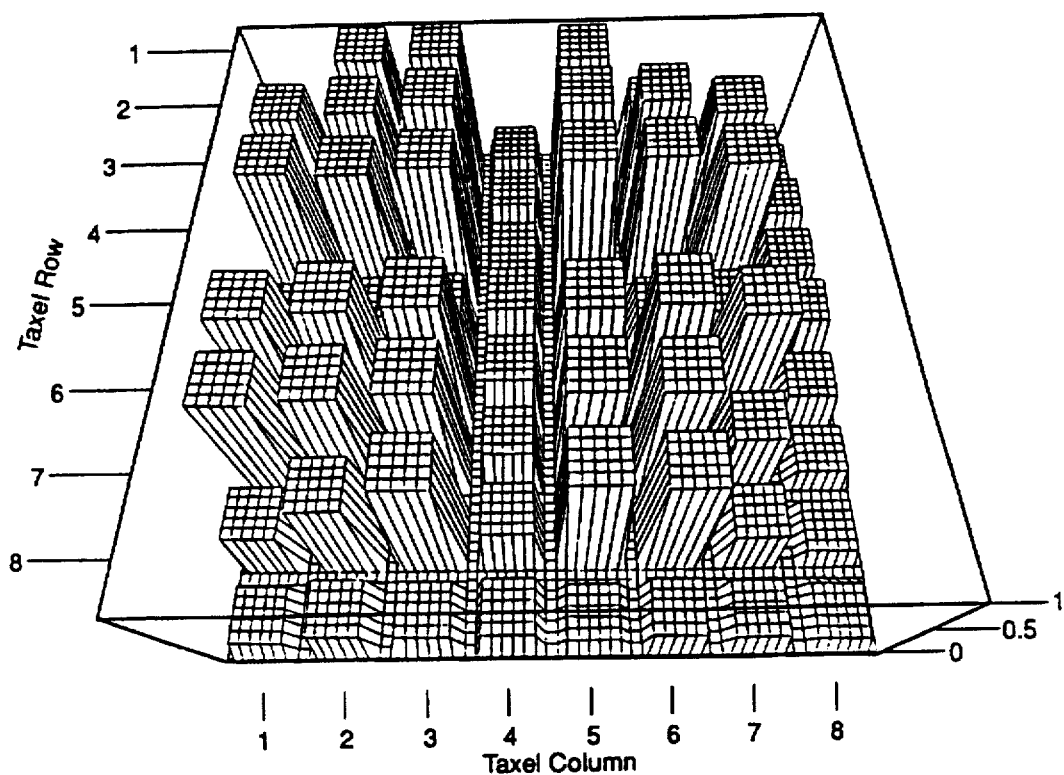
FIG. 6e shows a three-dimensional display of the normalized tactile sensor response to a cross-slotted screwhead shaped load force.
Figure 6F:
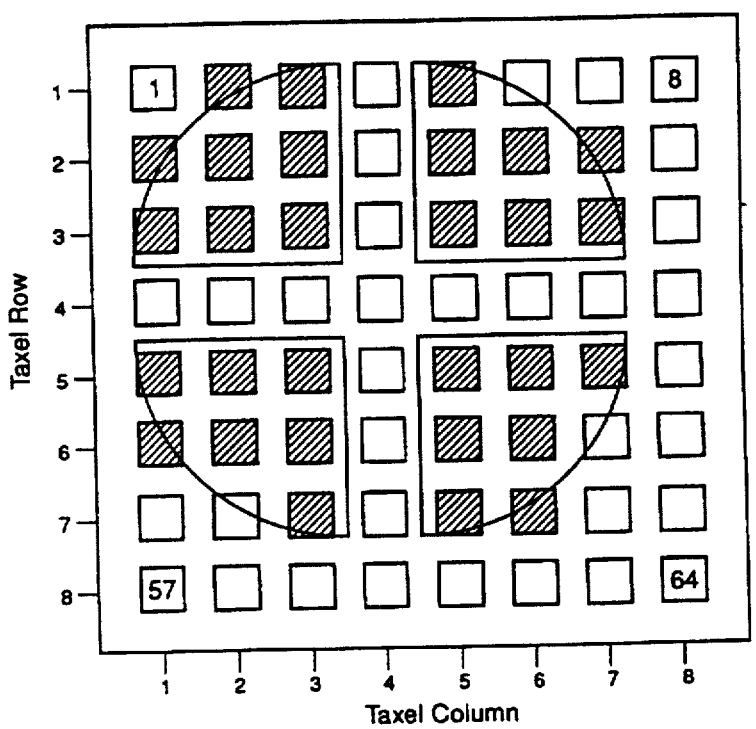
FIG. 6f shows an overlay representation of the FIG. 6e results on a tactile sensor element map (silhouette of the contacted object).

In FIG. 6, FIG. 6a represents a three-dimensional plot of the normalized voltage response along the z-axis for the Table 1 100 gmf trapezoid-shaped load versus position in the 8×8 taxel matrix in the xy-plane. FIG. 6b shows the corresponding overlay of the trapezoid shaped load as a shaded polygon relative to the normalized voltage response best-fit level (z=0.92 V). The FIG. 6b darkened taxels are those whose normalized response is greater than or equal to the threshold value (z=0.92 V). FIG. 6c shows a three-dimensional plot of the normalized voltage response for the 100 gmf toroid-shaped load of Table 1 versus position in the 8×8 taxel matrix. FIG. 6d is the corresponding overlay of the toroid shaped load in the shaded region relative to the normalized voltage response best-fit level (z=0.92 V); the darkened taxels are those whose normalized response is greater than or equal to the threshold value. Similarly, FIG. 6e shows a three-dimensional plot of the normalized voltage response for the Table 1 cross-slotted screw shaped load versus position in the 8×8 taxel matrix. FIG. 6f shows the corresponding overlay of a cross-slotted screw shaped load in the shaded regions relative to the normalized voltage response best-fit level (z=0.88 V), and the darkened taxels are those whose normalized response is greater than or equal to the threshold value.

The threshold value referred to here may be determined by averaging of all taxel response values, by the largest taxel value, or by other mathematical algorithms for analog-to-digital threshold determination that is known in the art. In the examples shown herein, a threshold value equal to 0.91 V (standard deviation=0.019 V) is used, and this arrangement (arithmetic average of several simple calibration load shapes) for threshold determination is preferred.

It is noted that the overall best-fit normalized voltage response value of $z_{ave}$=0.91 V; standard deviation=0.019 V agrees reasonably well with the level identified for the sharp-edge shaped load. To assess the validity of this image recognition criteria for loads spanning the linear response range of the sensor (0.8 to 135 gmf), the measurement process may be repeated for 10 and 50 gmf loads. The results associated with this repetition are included in Table 2. While not absolutely precise, the trend associated with the data in Table 2 suggests that a fundamental load shape, such as a sharp-edge, may be used to calibrate and establish the first-order criteria for generating the tactile object image of a load with a different shape.

By direct extension of the disclosed tactile object imaging technique, the gmf of an arbitrary load (limited to the sensor's linear response region) may be determined by using the characteristic best-fit normalized voltage threshold criteria ($z_{ave}$=0.91 V) to identify those taxels which define the load's silhouette. By then arithmetically averaging the pre-normalized voltage response values of the selected taxels, the equation of the linear least-squares sensor calibration line (FIG. 3) can be solved to estimate the corresponding gmf value of the applied load.

As is indicated above, a thermally induced signal response is also to be expected from many possible piezoelectric materials including the herein preferred PVDF polymer. Although constant temperature environmental conditions may be a feasible way of accommodating this condition in a taxel sensor, a more practical arrangement is to provide a real-time, in situ compensation system in which the temperature component of a taxel signal is accommodated. One such system can be achieved by including an extra taxel element or plural of such elements in the sensor array and exposing this extra element or plurality of them to the same environment as the other elements in the array, except to physically shield it (them) from load forces. (This can be accomplished by locating these taxels outside, but in close proximity to, the taxel sensing array on the IC substrate.)

The output signal of this shielded element(s) may be then used to subtract its thermally-induced response from the output signal of the normal taxel elements, or used to adjust a decision threshold level, or in other signal compensation arrangements that are known in the electronic art. Alternately, embedded thermistors or low thermal conductivity coatings may be used to limit the thermal or pyroelectric effect response of the taxel sensor array. Generally, the goal of these arrangements is to minimize heat transfer to the IC taxels from the load or the environment.

Alternate arrangements of the invention will be apparent to persons of skill in the related arts. These include, but are not limited to materials other than the disclosed PVDF film, silicon substrate and MOSFET amplifier, different physical dimensions for the PVDF film and other sensor component elements, and a differing overall size for the sensor.

With implementation of the initializing voltage bias technique and the other taxel arrangements disclosed herein, a taxel sensor and a first-order pattern recognition scheme that can be used to establish a load's shape with resolution at least on the order of 700 μm and to determine the approximate gmf of an applied load can be achieved.

While the apparatus and method herein described constitute a preferred embodiment of the invention, it is to be understood that the invention is not limited to this precise form of apparatus or method, and that changes may be made therein without departing from the scope of the invention which is defined in the appended claims.

BIBLIOGRAPHY

1. Dario P. and de Rossi D., Tactile Sensors and the Gripping Challenge, IEEE Spectrum, 22: 46–52, 1985.
2. Fielding P. J., Evaluation of a Robotic Tactile Sensing System, Sensors, 3: 35–46, 1986.
3. Barth P. W., Sensor Applications in Robotics, Robotics Engineering, 8: 195–218, 1986.
4. Regtien P. P. L., Sensors for Applications in Robotics, Sensors and Actuators, 10: 195–218, 1986.
5. Regtien P. P. L., Sensor Systems for Robot Control, Sensors and Actuators, 17: 91–101, 1989.
6. Rooks B., Tactile Sensing Should Not Be Forgotten, Sensor Review, 3: 2, 1983.
7. Severwright J., Tactile Sensor Arrays—The Other Option, Sensor Review, 3: 27–29, 1983.
8. Arbib M. A., Overton K. J. and Lawton D. T., Perceptual Systems for Robots, Interdisciplinary Science Reviews, 9: 31–46, 1984.
9. Harmon L. D., A Sense of Touch Begins to Gather Momentum, Sensor Review, 1: 82–88, 1981.
10. Harmon L. D., Tactile Sensing for Robotics, in Robotics and Artificial Intelligence, NATO Adv. Study Inst. Series F: Computer and System Science, vol. 11, Brady M., Gerhardt L. A. and Davidson H. F. (eds.), Springer-Verlag, Heidelberg, 1984.
11. Harmon L. D., Automated Tactile Sensing, Int. J. Robotics Research, 1: 3–32, 1986.
12. Harmon L. D., Robotic Taction for Industrial Assembly, Int. J. Robotics Research, 3: 72–76, 1983.
13. Giallorenzi T. G., Bucaro J. A., Dandridge A., Sigel G. H., Cole J. H., Rashleigh S. C. and Priest R. G., Optical Fiber Sensor Technology, IEEE J. Quantum Electronics, QE-18: 626–663, 1982.
14. Schneiter J. L. and Sheridan T. B., An Optical Tactile Sensor for Manipulators, Robotics Computer-Integrated Manufacturing, 1: 65–71, 1984.
15. King A. A. and White R. M., Tactile Sensing Array Based on Forming and Detecting an Optical Image, Sensors and Actuators, 8: 49–63, 1985.
16. Jenstrom D. L. and Chen C. L., A Fiber Optic Microbend Tactile Sensor Array, Sensors and Actuators, 20: 239–248, 1989.
17. Hok B., Tenerz L. and Gustafson K., Fiber-Optic Sensors: A Micro-Mechanical Approach, Sensors and Actuators, 17: 157–166, 1989.
18. Senturia S. D., The Role of the MOS Structure in Integrated Sensors, Sensors and Actuators, 4: 507–526, 1983.
19. Gutierrez-Monreal F. J. and Mari C. M., The Use of Polymer Materials as Sensitive Elements in Physical and Chemical Sensors, Sensors and Actuators, 12: 129–144, 1987.
20. Puers B., Sanson W. and Paszczyński S., Assessment of Thick-Film Fabrication Methods for Force (Pressure) Sensors, Sensors and Actuators, 12: 57–76, 1987.
21. Helsel M., Zemel J. N. and Dominko V., An Impedance Tomographic Tactile Sensor, Sensors and Actuators, 14: 93–98, 1988.
22. de Rossi D., Lazzeri L., Domenici C., Nannini A. and Basser P., Tactile Sensing by an Electromechanochemical Skin, Sensors and Actuators, 17: 107–111, 1989.
23. Raibert M. H. and Tanner J. E., Design and Implementation of a VLSI Tactile Sensing Computer, Int. J. Robotics Res., 1: 3–18, 1982.
24. Voorthuygen J. A. and Bergveld P., The PRESSFET: An Integrated Electret-MOSFET Based Pressure Sensor, Sensors and Actuators, 14: 507–526, 1983.
25. Bergveld P., The Impact of MOSFET-Based Sensors, Sensors and Actuators, 8: 109–127, 1985.
26. Sprenkels A. J., Voorthuygen J. A. and Bergveld P., A Theoretical Analysis of the Electret Air-Gap Field-Effect Structure for Sensor Applications, Sensors and Actuators, 9: 59–72, 1986.

27. Hackwood S., Beni G., Hornak L. A., Wolfe R. and Nelson T. J., A Torque-Sensitive Tactile Sensor Array for Robotics. Int. J. Robotics Res., 2: 46–50, 1985.
28. Dario P., Bardelli R., de Rossi D., Wang L. R. and Pinotti P. C., Touch-Sensitive Polymer Skin Uses Piezoelectric Properties to Recognize the Orientation of Objects. Sensor Review, 2: 194–198, 1982.
29. Gallantree H. R., Review of Transducer Applications of Polyvinylidene Fluoride. IEE Proc., 130: 219–224, 1983.
30. Pedotti A., Assente R., Fusi G., de Rossi D., Dario P. and Domenici C., Multisensor Piezoelectric Polymer Insole for Pedobarography, Ferroelectrics, 60: 163–174, 1984.
31. Chatigny J. V. and Robb L. E., Piezo Film Sensors, Sensors, 3: 50–56, 1986.
32. Gerliczy G. and Betz R., SOLEF PVDF Biaxially Oriented Piezo and Pyroelectric Films for Transducers, Sensors and Actuators, 12: 207–224, 1987.
33. Tzou H. S. and Pandita S., A Multi-Purpose Dynamic and Tactile Sensor for Robot Manipulators. J. Robotic Systems, 4: 719–731, 1987.
34. Kolesar, Jr. E. S., Reston R. R., Ford D. G. and Fitch, Jr. R. C., Multiplexed Piezoelectric Polymer Tactile Sensor, J. Robotic Systems, 9: 37–63, 1992.
35. Lerch R., Electroacoustic Transducers Using Piezoelectric Polyvinylidene Films. J. Acoust. Soc. Am., 66: 952–954, 1979.
36. Swartz R. G. and Plummer J. D., Integrated Silicon-PVF2 Acoustic Transducer Arrays. IEEE Trans. Electron. Dev., ED-26: 1921–1931, 1979.
37. Coiffet P., Remote Interaction: Proximity Sensing Robot Technology. Interaction with the Environment, Prentice-Hall, Inc. Englewood-Cliffs, N.J., 1981, Vol. 2, p. 5.
38. Gehlbach S. M. and Alvarez R. E., Digital Ultrasound Imaging Techniques Using Vector Sampling and Raster Line Reconstruction. Ultrasonic Imaging, 3: 83–107, 1981.
39. Kleinschmidt P. and Magori V., Ultrasonic Remote Sensors for Non-Contact Object Detection, Siemens Forsch. Entwickl. Ber., 10: 110–118, 1981.
40. Kuroda S., Jitsumori A. and Inari T., Ultrasonic Imaging System for Robots Using an Electronic Scanning Method, Robotica, 2: 47–53, 1984.
41. Tone M., Yano T. and Fukumoto A., High-Frequency Ultrasonic Transducer Operating in Air, Jpn. J. Appl. Phys., 23: L436-L438, 1984.
42. Beuter K. and Weiss R., Sound Pattern Recognition Supports Automatic Inspection, Sensor Review, 5: 13–17, 1985.
43. Brown M. K., Feature Extraction Techniques for Recognizing Solid Objects with an Ultrasonic Range Sensor, IEEE J. Robotics Automat., RA-1: 191–205, 1985.
44. Patterson R. W. and Nevill, Jr. G. E., The Induced Vibration Touch Sensor—A New Dynamic Touch Sensing Concept, Robotica, 4: 27–31, 1986.
45. Tsujimura T., Yabuta T. and Morimitsu T., Three-Dimensional Shape Recognition Method Using Ultrasonics for a Manipulator Control System, J. Robotic Systems, 3: 595–599, 1986.
46. Dario P. and Buttazzo G., An Anthropomorphic Robot Finger for Investigating Artificial Tactile Perception, Int. J. Robotics Res., 6: 25–48, 1987.
47. Borenstein J. and Koren Y., Obstacle Avoidance with Ultrasonic Sensors, J. Robotics Automat., 4: 213–218, 1988.
48. Fiorillo A. S., Allotta B., Dario P. and Francesconi R., An Ultrasonic Range Sensor Array for a Robotic Fingertip, Sensors and Actuators, 17: 103–106, 1989.
49. MOSIS—Metal Oxide Semiconductor Implementation System User's Manual. Information Science Institute, University of Southern California (USC/ISI), Marina del Rey, Calif., release 3.0, 1988.
50. Weste N. and Eshraghian K., Principles of CMOS VLSI Design—A Systems Perspective. Addison-Wesley Publishing Company, Reading, Mass, 1985, pp. 121–135.
51. Antognetti P. and Massobrio G., Semiconductor Device Modelling with SPICE. McGraw-Hill, New York, N.Y., 1988.

TABLE 1. Description of Load Shapes Useful for Evaluating Tactile Sensor Imaging Performance Load Shape Dimensions (mm)

Sharp Edge 5.8 (length)×0.7 (width)

Square 2.8 (edge length)

Trapezoid 4.2 (base)×2.7 (altitude)×1.5 (altitude)

Isosceles Triangle 3.7 (base)×3.8 (altitude)

Small Circle 2.7 (diameter)

Large Circle 4.2 (diameter)

Toroid 4.6 (outer diameter)×1.8 (inner diameter)

Slotted Screw 4.8 (diameter)×0.7 (slot width)

Cross-Slotted Screw 4.8 (diameter)×0.7 (slot width)

TABLE 2. Normalized Voltage Response Best-Fit Values For The Load Shapes

Applied Load

Load Shape 10 (gmf) 50 (gmf) 100 (gmf)

Sharp Edge 0.93 V 0.91 V 0.90 V

Square 0.88 V 0.90 V 0.91 V

Trapezoid 0.92 V 0.93 V 0.89 V

Isosceles Triangle 0.88 V 0.90 V 0.89 V

Small Circle 0.95 V 0.94 V 0.92 V

Large Circle 0.92 V 0.93 V 0.91 V

Toroid 0.95 V 0.90 V 0.92 V

Slotted Screw 0.92 V 0.91 V 0.91 V

Cross-Slotted Screw 0.91 V 0.90 V 0.88 V (Average=0.91 V; Standard Deviation=0.019 V)

What is claimed is:

1. Force magnitude and force pattern responsive tactile sensing apparatus comprising the combination of:

a two-dimensional array of electrode elements disposed in electrical and physical isolation across a planar surface area portion of a semiconductor substrate member;

a force responsive physically deformable film of piezoelectric effect material disposed over said array of electrode elements and said substrate member surface area portions, in electrical capacitance coupling with said electrode element array;

an electrically conductive common electrode member disposed over a second distal surface portion of said film of piezoelectric effect material and connected with a common return electrical node of said sensing apparatus;

electronic amplifier means, including a plurality of high input impedance electronic amplifier circuits physically disposed adjacent to said array of electrode elements with each said amplifier circuit having respective input nodes connected with one of said electrode elements and with said common return electrical node for amplifying a piezoelectric effect electrical charge signal received on said electrode element during sensed tactile force physical deformations of said film of piezoelectric effect material;

low voltage electrical charge generating means temporarily connected with each said electrode element of said array for pre-conditioning said piezoelectric effect material to a substantially uniform signal generation state prior to each said tactile force physical deformation.

2. The sensing apparatus of claim 1 wherein said physically deformable film of piezoelectric effect material is disposed in thickness deformable covering over said array of electrode elements.

3. The sensing apparatus of claim 2 wherein said piezoelectric effect material is an organic polymer material.

4. The sensing apparatus of claim 3 wherein said film of piezoelectric effect material is comprised of polyvinylidene fluoride and has a thickness between 15 μm and 100 μm.

5. The sensing apparatus of claim 4 wherein said film of polyvinylidene fluoride material is adhesively bonded to said substrate member, and said adhesive bonding includes a film of dielectric urethane inclusive adhesive material.

6. The sensing apparatus of claim 4 wherein said electrical charge signal is of a transient signal nature in response to a continuous thickness deformation of said polyvinylidene fluoride film by said sensed force.

7. The sensing apparatus of claim 4 wherein said pre-conditioning of said piezoelectric material includes a physical thickness altering response to said temporary connection of said electrical charging means.

8. The sensing apparatus of claim 4 wherein said substrate member is comprised of silicon and said electrode elements are comprised of metallic film attached to said substrate member.

9. The sensing apparatus of claim 8 wherein said electrode elements comprise a square shaped array of square shaped individual electrodes.

10. The sensing apparatus of claim 9 wherein said square shaped individual electrodes are separated by a substrate surface interval that is at least 75% of the size of each said electrode.

11. The sensing apparatus of claim 4 wherein said electronic amplifier circuits each have an input impedance of ten raised to the exponent of twelve ohms.

12. The sensing apparatus of claim 11 wherein said substrate member is comprised of one of the materials silicon and gallium arsenide and said electronic amplifier circuits each have a metal oxide-semiconductor field-effect transistor input stage with a gate electrode thereof being connected with one of said electrode elements in said array.

13. The sensing apparatus of claim 1 wherein said electronic amplifier circuits are also disposed on said semiconductor substrate member.

14. The sensing apparatus of claim 1 wherein said electrical charge generating means is electively connected with each said electrode element via an electronic multiplexer switching circuit.

15. The sensing apparatus of claim 14 wherein said electronic multiplexer switching circuit has an off state electrical resistance characteristic of ten raised to the exponent of twelve ohms.

16. The sensing apparatus of claim 1 wherein said electrical charge generating means is electively connected with each said electrode element via a mechanical switching element.

17. The sensing apparatus of claim 1 further including detection threshold selecting circuit means responsive to an output signal of at least one of said amplifier circuits for determining presence and absence of significant force magnitude at each of said electrode elements.

18. The sensing apparatus of claim 1 further including an additional electrode element disposed in electrical isolation on said substrate member and also isolated from said sensed forces for generating a sensing apparatus temperature responsive electrical reference signal.

19. The sensing apparatus of claim 1 wherein said substrate member is comprised of ten to the exponent of fourteen ohm centimeter resistivity, silicon dioxide material of three microns thickness dimension.

20. The method of tactile force sensing comprising the steps of:

generating a spatial map related array of discrete electrical signals each representing a force magnitude at a predetermined planar location within an applied force field;

said signal generating step including capacitively sensing local quantums of electrical charge displaced to surface adjacent portions of a piezoelectric film by physical deformation of said film from said applied force field;

each said signal generating step being preceded by a temporary low voltage electrical signal induced output signal range limiting physical preconditioning of said piezoelectric film; and amplifying each said discrete electrical signal of said array in an amplifying each said discrete electrical signal of said array in an amplifying location disposed adjacent said spatial map signal location.

* * * * *